(12) United States Patent
Yoon et al.

(10) Patent No.: US 8,937,320 B2
(45) Date of Patent: Jan. 20, 2015

(54) LIGHT EMITTING DEVICE AND LIGHTING APPARATUS HAVING CRYSTAL CONTROL LAYER

(75) Inventors: Ho Sang Yoon, Seoul (KR); Sang Kyun Shim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 180 days.

(21) Appl. No.: 13/366,665

(22) Filed: Feb. 6, 2012

(65) Prior Publication Data

US 2012/0223347 A1    Sep. 6, 2012

(30) Foreign Application Priority Data

Mar. 2, 2011  (KR) .......................... 10-2011-0018686

(51) Int. Cl.
*H01L 33/00*    (2010.01)
*H01L 33/02*    (2010.01)

(52) U.S. Cl.
CPC ..................................... *H01L 33/02* (2013.01)
USPC ........................................................... 257/79

(58) Field of Classification Search
CPC ....... H01L 33/12; H01L 33/14; H01L 33/145; H01L 33/025
USPC ............................................ 257/13, 14, 15, 79
See application file for complete search history.

(56) References Cited

U.S. PATENT DOCUMENTS

| | | | | |
|---|---|---|---|---|
| 6,337,493 | B1 * | 1/2002 | Tanizawa et al. | 257/79 |
| 2010/0019225 | A1 * | 1/2010 | Lee | 257/13 |
| 2010/0044674 | A1 * | 2/2010 | Kim | 257/13 |
| 2010/0051978 | A1 * | 3/2010 | Katsuno et al. | 257/94 |
| 2010/0133506 | A1 * | 6/2010 | Nakanishi et al. | 257/13 |
| 2012/0201264 | A1 * | 8/2012 | Shatalov et al. | 372/45.01 |

* cited by examiner

*Primary Examiner* — Benjamin Sandvik
*Assistant Examiner* — Farid Khan
(74) *Attorney, Agent, or Firm* — Birch, Stewart, Kolasch & Birch, LLP

(57) ABSTRACT

Provided are a light emitting device, a light emitting device package, and a lighting apparatus. The light emitting device includes: an n-type semiconductor layer including a first area and a second area in a plane; an active layer disposed on the n-type semiconductor layer in the first area; an electron barrier layer disposed on the active layer in the first area; and a p-type semiconductor layer disposed on the electron barrier layer in the first area.

18 Claims, 12 Drawing Sheets

LIGHT EMITTING DEVICE AND LIGHTING APPARATUS HAVING CRYSTAL CONTROL LAYER

The present application claims priority under 35 U.S.C. 119 to Korean Patent Application No. 10-2011-0018686, filed on Mar. 2, 2011, which is hereby incorporated by reference in its entirety.

BACKGROUND

The present disclosure relates to a light emitting device, a light emitting device package, and a lighting apparatus.

A Light Emitting Diode (LED) is typically used as a light emitting device. The LED converts electrical signals into the form of light such as infrared or visible rays by using characteristics of a compound semiconductor.

As light efficiency of a light emitting device is increased, it is used for various electrical and electronic devices such as a display device and a lighting device.

SUMMARY

Embodiments provide a light emitting device, a light emitting device package, and a lighting apparatus, which have a new structure.

Embodiments also provide a light emitting device, a light emitting device package, and a lighting apparatus, which reduce crystal defects and improve brightness and driving characteristics.

In one embodiment, a light emitting device comprises: an n-type semiconductor layer including a first area and a second area in a plane; an active layer disposed on the n-type semiconductor layer in the first area; an electron barrier layer disposed on the active layer in the first area; and a p-type semiconductor layer disposed on the electron barrier layer in the first area, wherein the p-type semiconductor layer comprises a first semiconductor layer having a first dopant concentration, a second semiconductor layer having a second dopant concentration on the first semiconductor layer, a third semiconductor layer having a third dopant concentration on the second semiconductor layer, and a fourth semiconductor layer having a fourth dopant concentration on the third semiconductor layer: the second dopant concentration has a smaller value than the first dopant concentration and the third dopant concentration; and the fourth dopant concentration has a value of less than or equal to about $2\times10^{20}/cm^3$, which is greater than the third dopant concentration.

In another embodiment, a light emitting device comprises: an n-type semiconductor layer; an active layer disposed on the n-type semiconductor layer; an electron barrier layer disposed on the active layer; and a p-type semiconductor layer disposed on the electron barrier layer, and comprises a first semiconductor layer having a first dopant concentration, a second semiconductor layer having a second dopant concentration, a third semiconductor layer having a third dopant concentration, and a fourth semiconductor layer having a fourth dopant concentration, wherein the second dopant concentration has a smaller value than the first dopant concentration and the third dopant concentration; and the fourth dopant concentration has a value of less than or equal to about $2\times10^{20}/cm^3$, which is greater than the third dopant concentration.

In further another embodiment, a lighting apparatus comprises: a case main body; a light emitting module comprising a light emitting device at the case main body; and a connection terminal disposed at the case main body to receive power from an external power supply, wherein the light emitting device comprises: an n-type semiconductor layer including a first area and a second area in a plane; an active layer disposed on the n-type semiconductor layer in the first area; an electron barrier layer disposed on the active layer in the first area; and a p-type semiconductor layer disposed on the electron barrier layer in the first area, wherein the p-type semiconductor layer comprises a first semiconductor layer having a first dopant concentration, a second semiconductor layer having a second dopant concentration on the first semiconductor layer, a third semiconductor layer having a third dopant concentration on the second semiconductor layer, and a fourth semiconductor layer having a fourth dopant concentration on the third semiconductor layer; the second dopant concentration has a smaller value than the first dopant concentration and the third dopant concentration; and the fourth dopant concentration has a value of less than or equal to about $2\times10^{20}/cm^3$, which is greater than the third dopant concentration.

In still further another embodiment, a lighting apparatus comprises: a case main body; a light emitting module comprising a light emitting device at the case main body; and a connection terminal disposed at the case main body to receive power from an external power supply, wherein the light emitting device comprises: an n-type semiconductor layer; an active layer disposed on the n-type semiconductor layer; an electron barrier layer disposed on the active layer; and a p-type semiconductor layer disposed on the electron barrier layer, and comprises a first semiconductor layer having a first dopant concentration, a second semiconductor layer having a second dopant concentration, a third semiconductor layer having a third dopant concentration, and a fourth semiconductor layer having a fourth dopant concentration, wherein the second dopant concentration has a smaller value than the first dopant concentration and the third dopant concentration; and the fourth dopant concentration has a value of less than or equal to about $2\times10^{20}/cm^3$, which is greater than the third dopant concentration.

The details of one or more embodiments are set forth in the accompanying drawings and the description below. Other features will be apparent from the description and drawings, and from the claims.

DETAILED DESCRIPTION OF THE EMBODIMENTS

Figure 1:
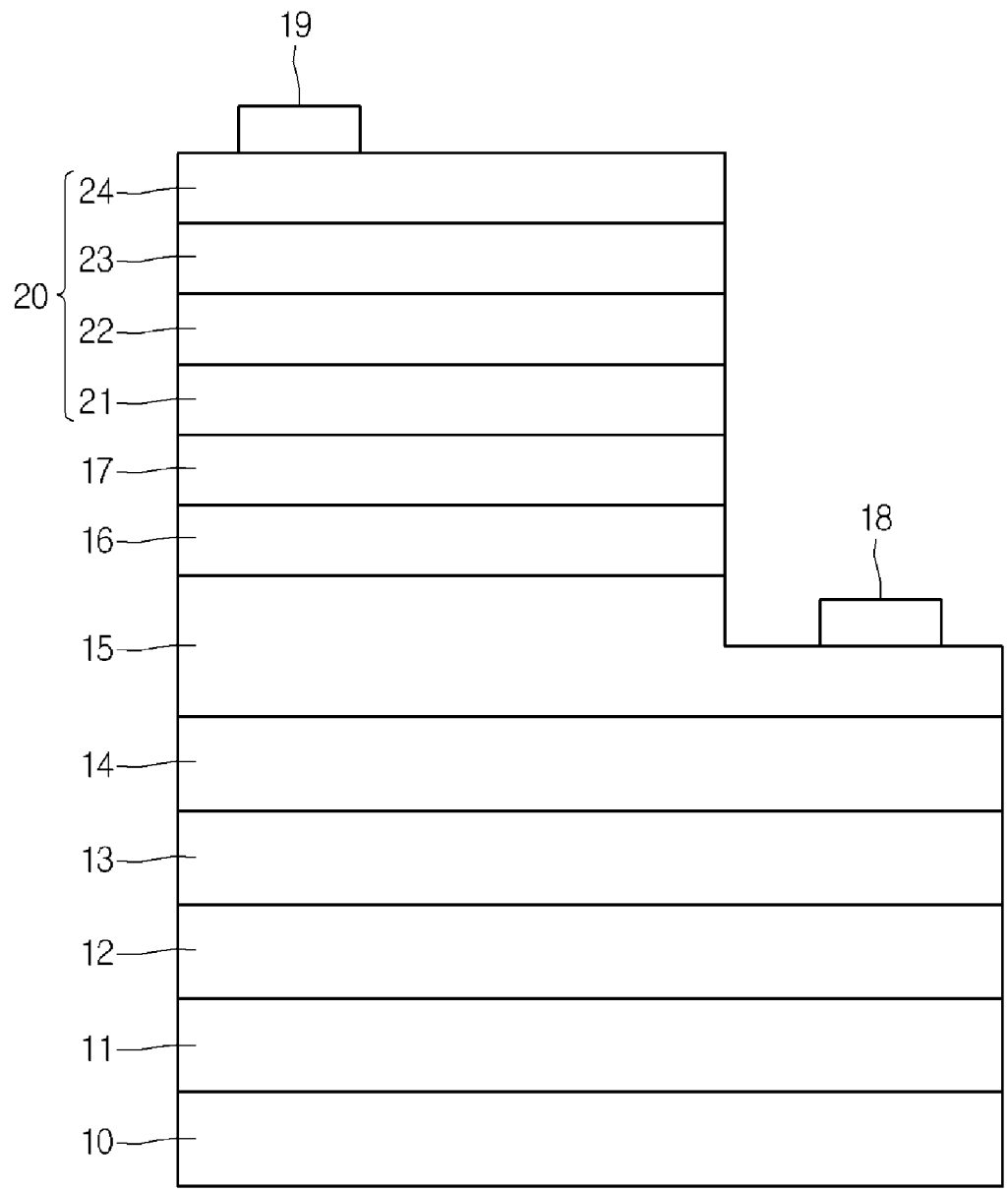
FIG. 1 is a sectional view of a light emitting device according to an embodiment.

In the description of embodiments, it will be understood that when a layer (or film), region, pattern or structure is referred to as being 'on' or 'under' another layer (or film), region, pad or pattern, the terminology of 'on' and 'under' comprises both the meanings of 'directly' and 'indirectly'. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, a light emitting device and a light emitting device package according to embodiments will be described with reference to the accompanying drawings.

FIG. 1 is a sectional view of a light emitting device according to an embodiment.

The light emitting device may comprise an n-type semiconductor layer 14, an active layer 16, an electron barrier layer 17, and a p-type semiconductor layer 20.

The n-type semiconductor layer 14 may comprise a first area and a second area in a plane. The active layer 16 may be disposed in the first area and also may be disposed on the n-type semiconductor layer 14. The electron barrier layer 17 may be disposed in the first area and also may be disposed on the active layer 16. The p-type layer 20 may be disposed in the first area and also may be disposed on the electron barrier layer 17. The p-type semiconductor layer 20 may comprise a first semiconductor layer 21 having a first dopant concentration, a second semiconductor layer 22 having a second dopant concentration on the first semiconductor layer 21, a third semiconductor layer 23 having a third dopant concentration on the second semiconductor layer 22, and a fourth semiconductor layer 24 having a fourth dopant concentration on the third semiconductor layer 23.

The light emitting device may further comprise a first electrode 18 in the second area of the n-type semiconductor layer 14. An n-type contact layer 15 may be disposed between the n-type semiconductor layer 14 and the first electrode 18. The n-type contact layer 15 may be disposed on the n-type semiconductor layer 14, and may have a first thickness in the first area and a second thickness in the second area.

The light emitting device may comprise a substrate 10, a buffer layer 11, an undoped semiconductor layer 12, and a crystal control layer 13, below the n-type semiconductor layer 14. The first electrode 18 may be disposed on the n-type contact layer 15, and a second electrode 19 may be disposed on the p-type semiconductor layer 20.

The substrate 10 may be formed of at least one of sapphire (Al2O3), SiC, Si, GaAs, GaN, ZnO, GaP, InP, and Ge. An uneven pattern may be formed on the top surface of the substrate 10. Crystal quality of a semiconductor layer growing on the substrate 10 may be improved by the uneven pattern. The buffer layer 11 may be disposed on the substrate 10. For example, the buffer layer 11 may be formed of a compound semiconductor. The buffer layer 11 may be formed of a Group III-V elements compound semiconductor. The undoped semiconductor layer 12 may be disposed on the buffer layer 11. For example, the undoped semiconductor layer 12 may be formed of an undoped GaN based semiconductor layer.

The crystal control layer 13 may be disposed on the undoped semiconductor layer 12. The crystal control layer 13 may be formed with an AlGaN/GaN layer stacked structure or a superlattice structure. The crystal control layer 13 may suppress crystal defect occurrence caused by lattice mismatching of the substrate 10 and the GaN based semiconductor layer. That is, electric potential generation progressing in a growth direction may be suppressed. Moreover, a semiconductor layer doped with In instead of the undoped semiconductor layer 12 may be disposed and the present invention is not limited thereto. The undoped semiconductor layer 12 or/and the crystal control layer 13 may not be formed, and this feature may vary within the technical range of an embodiment.

The n-type semiconductor layer 14 may be formed on the crystal control layer 13, and the n-type contact layer 15 may be formed on the n-type semiconductor layer 14. The n-type semiconductor layer 14 and the n-type contact layer 15 may be formed of a Group III-V compound semiconductor doped with an n-type dopant. For example, the n-type semiconductor layer 14 and the n-type contact layer 15 may comprise at least one of be formed of GaN, InN, AlN, InGaN, AlGaN, InAlGaN, and AlInN. The n-type semiconductor layer 14 and the n-type contact layer 15 may comprise In as a dopant. Moreover, although the n-type semiconductor layer 14 and the n-type contact layer 15 are separated in FIG. 1, they may be formed of one layer. For example, the n-type semiconductor layer 14 may be formed to serve as the n-type contact layer 15.

The active layer 16 may be disposed in the first area of the n-type contact layer 15, and the first electrode 18 may be disposed in the second area of the n-type contact layer 15. The active layer 16 may be formed with a single well structure or a multi well structure. The active layer 16 may be formed in a period of a well layer and a barrier layer by using compound semiconductor materials of Group III-V elements, for example, in a period of $In_xAl_yGa_{(1-x-y)}N$ well layer/$In_aAl_bGa_{(1-a-b)}N$ barrier layer ($0<x\leq1$, $0\leq y\leq1$, $0\leq x+y\leq1$, $0\leq a\leq1$, $0\leq b\leq1$, $0\leq a+b\leq1$).

A method of growing the active layer 16 supplies nitrogen or/and hydrogen as a carrier gas in a predetermined growth temperature, and selectively supplies $NH_3$, TMGa (or TEGa), TMIn, and TMAl in order to alternately grow a well layer and a barrier layer. The growth temperatures of the well layer and the barrier layer may be the same or the growth temperature of the barrier layer may be higher than that of the well layer.

At this pint, the growth speed of the well layer may be less than about 0.2 Å/sec (i.e., slow speed) and the well layer may be thickly grown in about 28 Å to about 32 Å. An In composition in the well layer is at least about 10% for growth, and a single or multi barrier layer may be formed on the well layer. One or a plurality of pairs of the well layer/barrier layer may be grown.

The electron barrier layer 17 may be disposed on the active layer 16. The electron barrier layer 17 may be disposed on the active layer 16, and for example, may be formed of an AlGaN layer or an AlInN layer comprising a p-type impurity such as Mg. The electron barrier layer 17 may be directly on the active layer 16, and may be disposed on the active layer 16 with another semiconductor layer interposed. For example, a p-type buffer layer may be further disposed between the active layer 16 and the electron barrier layer 17. The p-type buffer layer may be formed of a Group III-V elements compound semiconductor doped with a p-type dopant such as InAlGaN or AlGaN. The p-type buffer layer may not be formed, and the present invention is not limited thereto.

The p-type semiconductor layer 20 is disposed on the electron barrier layer 17. For example, the p-type semiconductor layer 20 may be formed of a single layer or a multi layer by using GaN, InN, AlN, InGaN, AlGaN, InAlGaN, and AlInN. The p-type semiconductor layer 20 may comprise a p-type dopant such as Mg.

In order to improve internal quantum efficiency in the light emitting device, the electron barrier layer 17 is formed between the active layer 16 and the p-type semiconductor layer 20.

In order to improve performance for emitting the light of the light emitting device, it is important that electrons and holes are injected into the active layer 16 as efficiently as possible, and are recombined without leakage to be converted into light.

The electrons injected in the active layer 16 have a much faster mobility speed than the holes, and most likely leak into the p-type semiconductor layer 20 through the active layer due to thermal electron escape caused by thermal energy occurring in the active layer 16. Accordingly, in order to prevent the electrons from leaking into the p-type semiconductor layer 20, the electron barrier layer 17 having a larger band gap than the active layer 16 may be formed and used as a barrier of the electrons.

According to the light emitting device, the p-type semiconductor layer 20 may comprise a first semiconductor layer 21, a second semiconductor layer 22, a third semiconductor layer 23, and a fourth semiconductor layer 24. The first semiconductor layer 21 has a first dopant concentration; the second semiconductor layer 22 has a second dopant concentration; the third semiconductor layer 23 has a third dopant concentration; and the fourth semiconductor layer 24 has a fourth dopant concentration.

The second dopant concentration may have a smaller value than the first and third dopant concentrations, and the fourth dopant concentration may have a larger value than the third dopant concentration.

Moreover, according to an embodiment, suggested is a method of differently controlling the concentration of a dopant in each semiconductor layer constituting the p-type semiconductor layer 20 according to the size of a growth substrate.

For example, when a 2 inch growth substrate is used, in order to obtain an Electro Static Discharge (ESD) tolerance, the first semiconductor layer 21 may be formed with a p-type dopant concentration of about $1\times10^{20}$%/cm$^3$ to about $2\times10^{20}$/cm$^3$ and the second semiconductor layer 22 may be formed with a p-type dopant concentration of less than about $1\times10^{19}$/cm$^3$. Additionally, the third semiconductor layer 23 is formed to have a p-type dopant concentration of about $1\times10^{20}$/cm$^3$ to about $2\times10^{20}$/cm$^3$, and the fourth semiconductor layer 24 may be formed to have a p-type dopant concentration of more than about $2\times10^{20}$/cm$^3$ in order to lower resistance. The p-type dopant concentration in the p-type semiconductor layer 20 has a [P+/P0/P+/P++] form, and satisfies electrical and optical properties that the light emitting device requires.

Figure 2:
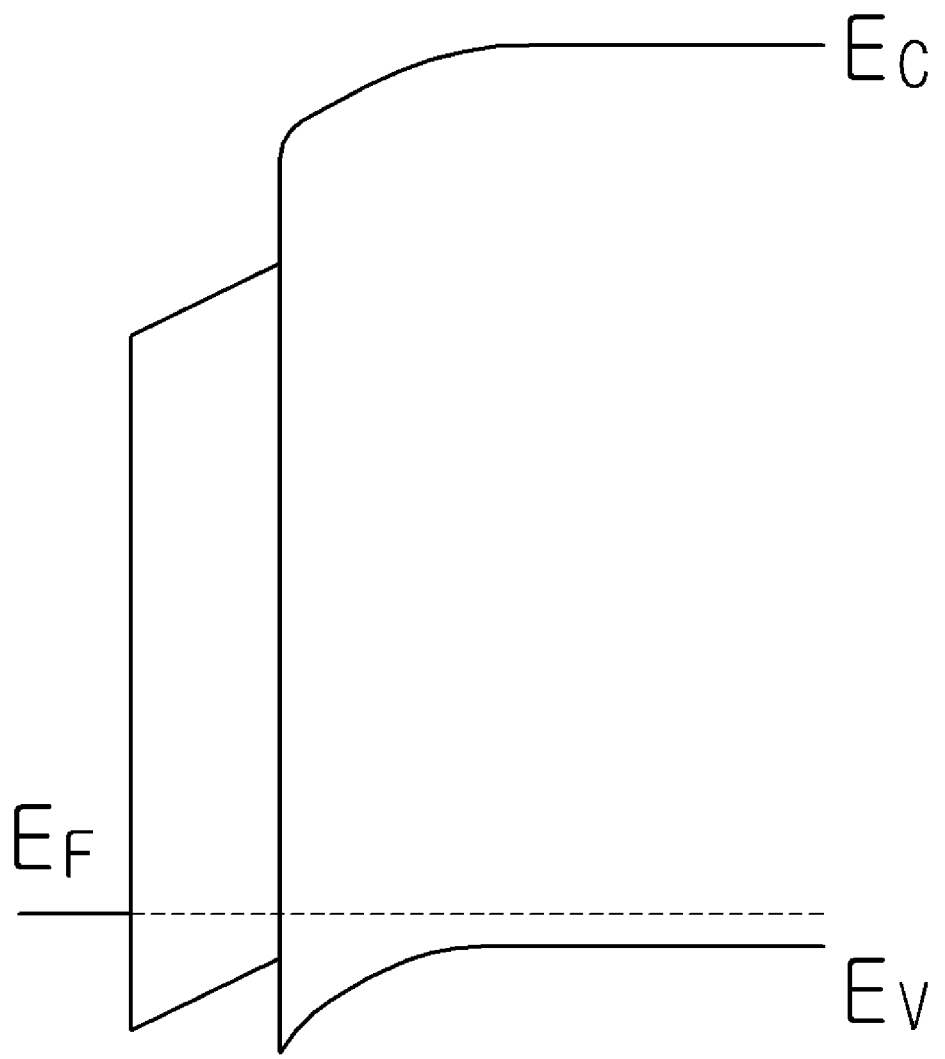
FIG. 2 is a view illustrating an energy band of a p-type semiconductor layer according to an embodiment.
Figure 3:
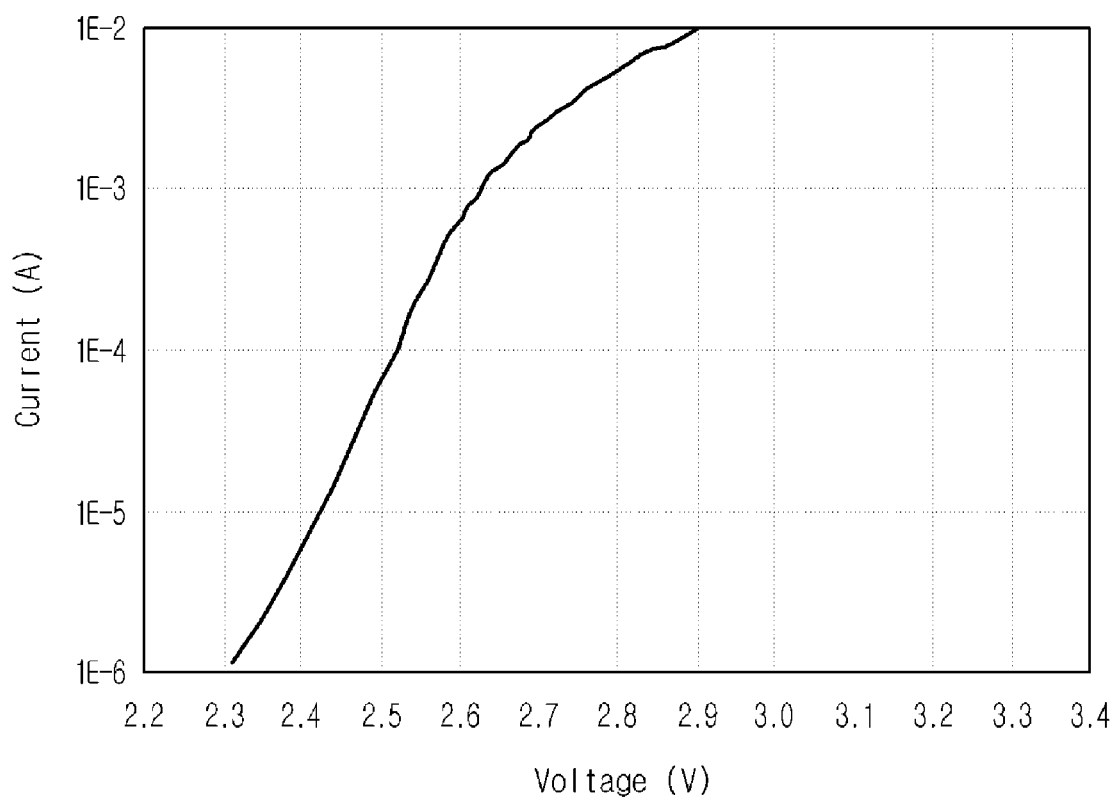
FIG. 3 is a view illustrating a current-voltage curve of a light emitting device according to an embodiment.
Figure 4:
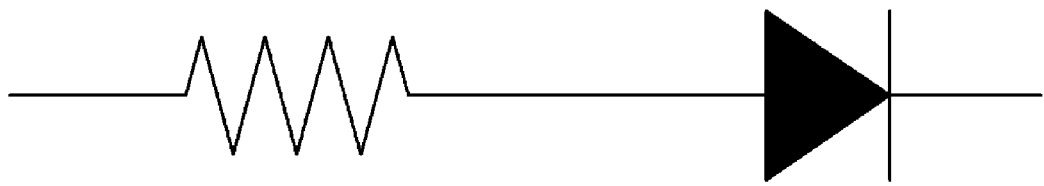
FIG. 4 is a view illustrating an operating circuit of a light emitting device according to an embodiment.

When a 2 inch growth substrate is used, strain occurring when a compound semiconductor layer grows is appropriately relaxed, and the growth continues. Accordingly, as shown in FIGS. 2 and 3, the depth of Ev where holes are gathered is low in the fourth semiconductor layer 24 of the p-type semiconductor layer 20, so that the holes are relatively easily tunneled. As a result, the current-voltage curve of the light emitting device continues according to Ohm's law as shown in FIG. 3. FIG. 2 is a view illustrating an energy band of a p-type semiconductor layer when a 2 inch growth substrate is used. FIG. 3 is a view illustrating the current-voltage curve of a light emitting device when a 2 inch growth substrate is used. Moreover, this light emitting device may be interpreted as FIG. 4 in terms of a circuit. FIG. 4 is a view illustrating an operating circuit of a light emitting device when a 2 inch growth substrate.

However, when a large diameter substrate of a more than 3 inches is used to improve productivity, wafer warping may occur more severely than the 2 inch substrate during growth. Due to this, growth conditions become unbalanced, so that strain occurring during growth is not relaxed at a certain position. That is, as shown in FIG. 5, Ev may be formed very deeply in the fourth semiconductor layer 24 of the p-type semiconductor layer 20.

Figure 5:
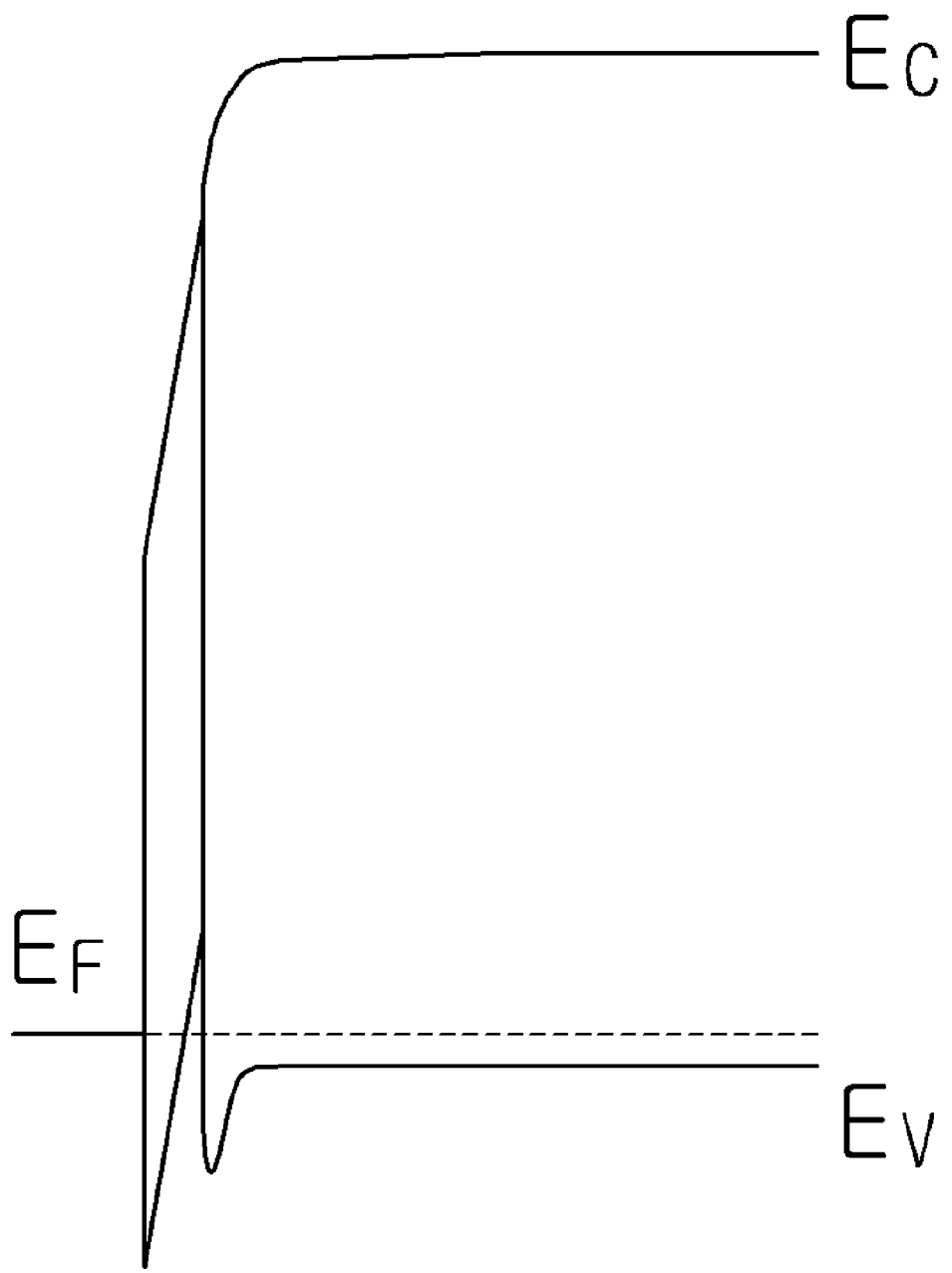
FIG. 5 is a view illustrating an energy band of a p-type semiconductor layer according to another embodiment.
Figure 6:
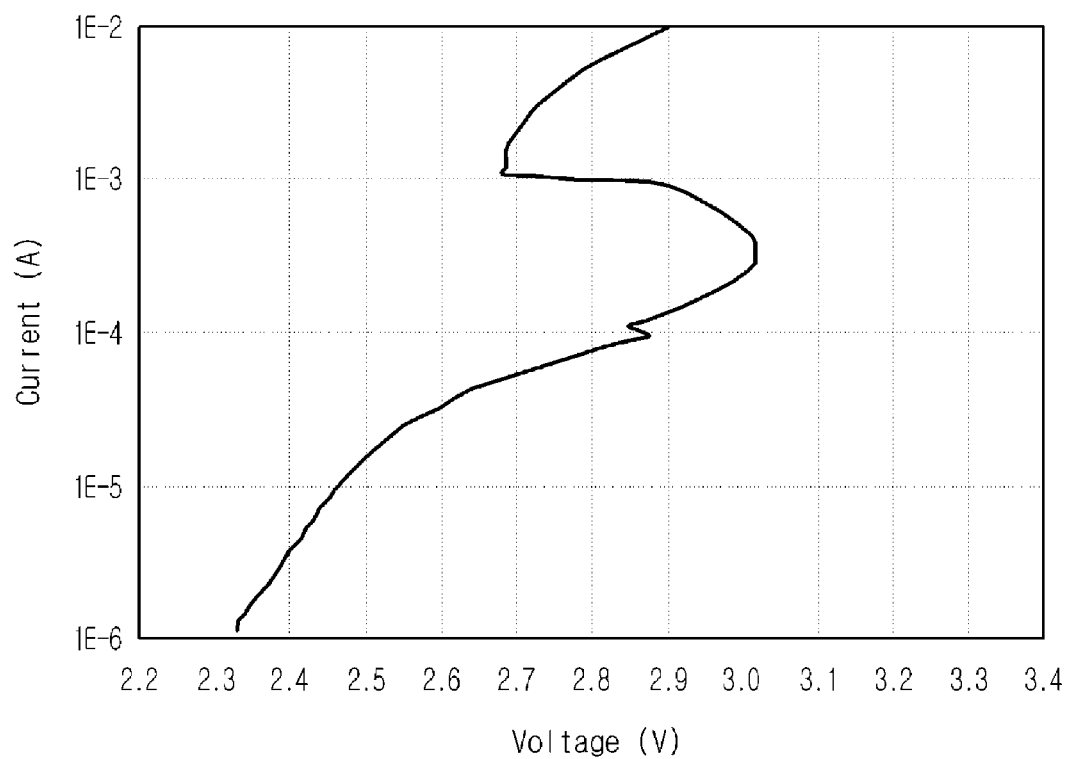
FIG. 6 is a view illustrating a current-voltage curve of a light emitting device according to another embodiment.
Figure 7:
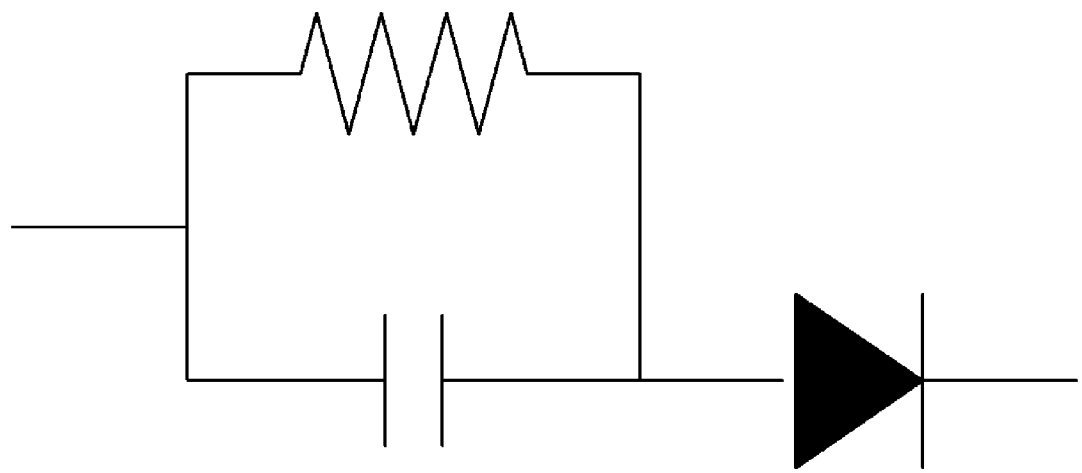
FIG. 7 is a view illustrating an operating circuit according to another embodiment.

FIG. 5 is a view illustrating an energy band of a p-type semiconductor layer when a 3 inch growth substrate is used. FIG. 6 is a view illustrating a current-voltage curve when a 3 inch growth substrate is used. FIG. 7 is a view illustrating an operating circuit when a 3 inch growth substrate is used.

As mentioned above, when Ev becomes deep, holes injected from an electrode are not tunneled in a contact area of the electrode and a semiconductor layer and thus are gathered, so that a kind of a capacitor phenomenon occurs. Accordingly, this may be interpreted as shown in FIG. 7 in terms of a circuit. As a result, as shown in FIG. 6, a discontinuous current-voltage curve that does not follow Ohm's law is formed. When a light emitting device having the discontinuous current-voltage characteristic that does not follow Ohm's law is applied to a product requiring initial operating characteristics such as a notebook computer, operational malfunction may occur.

As mentioned above, when a large diameter growth substrate of more than 3 inches is used, greater strain than typical one occurs when a compound semiconductor layer is grown. Accordingly, when the fourth semiconductor layer 24, that is, the uppermost layer of the p-type semiconductor layer 20, has a high dopant concentration as suggested above, since Ev becomes excessively deep, the fourth semiconductor layer 24 needs to be controlled to have a relatively low dopant concentration compared to when a 2 inch growth substrate is used.

Ev of an area contacting the second electrode 19 is affected from contained doping concentration. As concentration becomes higher, Ev becomes deeper. Accordingly, when a large diameter substrate of more than 3 inches is used, the concentration of the fourth semiconductor layer 24 may be controlled to prevent EV from becoming excessively deeper, and hole tunneling may be easily realized in a contact area of the second electrode 19 and the fourth semiconductor layer 24.

Figure 8:
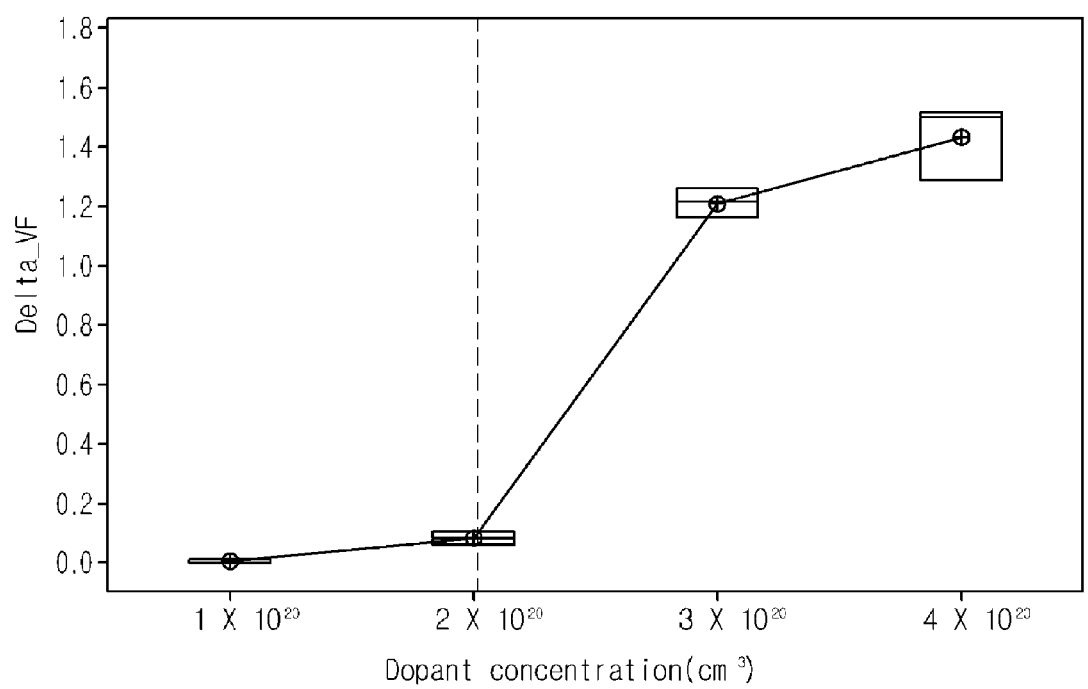
FIG. 8 is a view of a stabilizer voltage deviation according to a doping concentration change in a light emitting device grown according to another embodiment.

FIG. 8 is a view of a stabilizer voltage deviation according to a doping concentration change of the fourth semiconductor layer 24 in a light emitting device grown using a 3 inch growth substrate. Here, Delta_VF in the y axis represents a difference between VF raising high at the initial driving and stabilized VF. That is, when a doping concentration of the fourth semiconductor layer 24 is high, as shown in FIG. 6, there may be an area where the current-voltage curve does not follow Ohm's law. Delta_VF represents the degree of a voltage deviation between a curve interval against Ohm's law and a curve following Ohm's law.

As shown in FIG. 8, when the p-type dopant concentration has a value of less than about $2\times10^{20}$/cm$^3$, a value of Delta_VF becomes drastically smaller. By controlling a doping concentration of each semiconductor layer constituting the p-type semiconductor layer 20 on the basis of the data, a light emitting device whose a current-voltage curve follows Ohm's law may be realized.

For example, when a 3 inch growth substrate is used, in order to obtain an ESD tolerance, the first semiconductor layer 21 may be controlled to have a p-type dopant concentration of about $5\times10^{19}/cm^3$ to about $1\times10^{20}/cm^3$ and the second semiconductor layer 22 may be controlled to have a p-type dopant concentration of less than about $1\times10^{19}/cm^3$. Additionally, the third semiconductor layer 23 is controlled to have a p-type dopant concentration of about $5\times10^{19}/cm^3$ to about $1\times10^{20}/cm^3$, and the fourth semiconductor layer 24 may be controlled to have a greater value than the third semiconductor layer 23 and a value of less than about $2\times10^{20}/cm^3$.

Thus, by controlling a doping concentration of the p-type dopant added to the first to fourth semiconductor layers 21, 22, 23, and 24 constituting the p-type semiconductor layer 20 according to the size of the growth substrate, a light emitting device whose a current-voltage curve follows Ohm's law may be realized. Accordingly, when the light emitting device is applied to a product requiring initial operating characteristics such as a notebook computer, operational malfunction may be prevented.

A transparent electrode may be further disposed between the p-type semiconductor layer 20 and the second electrode 19. The transparent electrode may comprise at least one of ITO, In—ZnO (IZO), Ga—ZnO (GZO), Al—ZnO (AZO), Al—Ga ZnO (AGZO), In—Ga ZnO (IGZO), IrOx, RuOx, RuOx/ITO, Ni/IrOx/Au, and Ni/IrOx/Au/ITO, but is not limited thereto.

Figure 9:
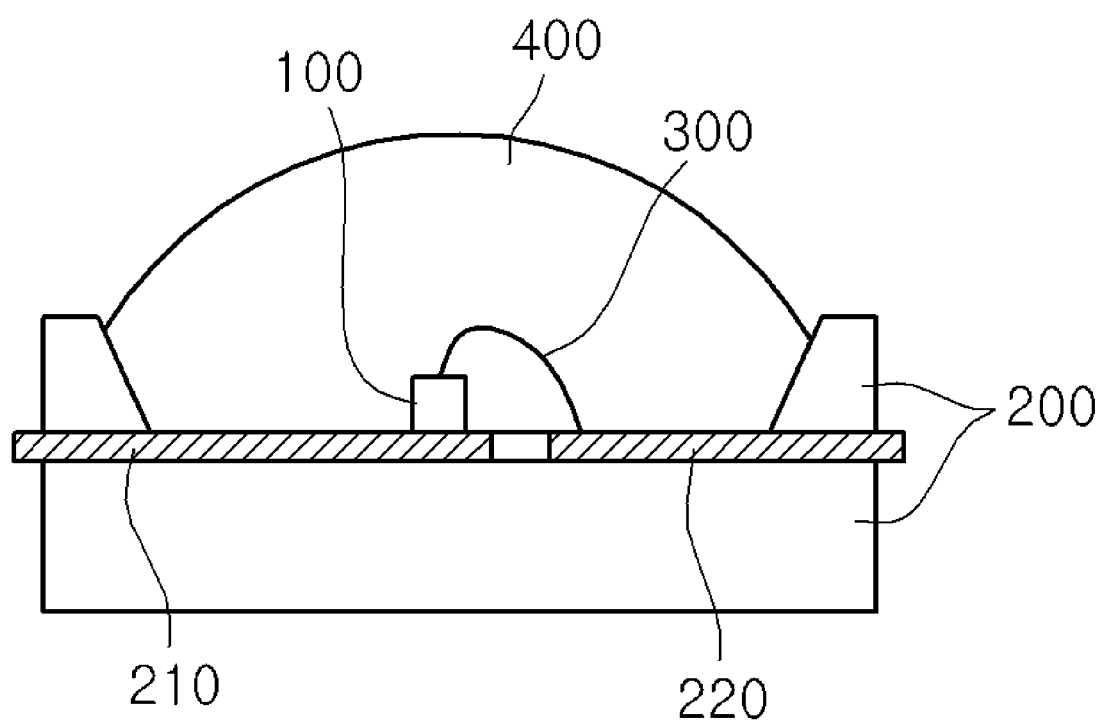
FIG. 9 is a view of a light emitting device package having a light emitting device applied according to an embodiment.

FIG. 9 is a view of a light emitting device package having a light emitting device applied according to an embodiment.

Referring to FIG. 9, the light emitting device package comprises a main body unit 200, a first electrode layer 210 and a second electrode layer 220 in the main body unit 200, a light emitting device 100 installed at the main body unit 200 and electrically connected to the first electrode layer 210 and the second electrode layer 220, and a molding member 400 surrounding the light emitting device 100.

The main body unit 200 may be formed of silicon material, synthetic resin material, or metal material, and an inclined plane may be formed around the light emitting device 100.

The first electrode layer 210 and the second electrode layer 220 are electrically separated from each other, and serve to provide power to the light emitting device 100. Additionally, the first electrode layer 210 and the second electrode layer 220 may serve to increase light efficiency by reflecting the light generated from the light emitting device 100, and may also serve to exhaust the heat generated from the light emitting device 100 to the external.

The light emitting device 100 may be applied to the light emitting devices according to the above described embodiments, and may be disposed on the main body unit 200 or the first electrode layer 210 or the second electrode layer 220.

The light emitting device 100 may be electrically connected to the first electrode layer 210 and/or the second electrode layer 220 through a wire 300. According to the embodiment, since the light emitting device 100 having a vertical type is exemplarily shown, one wire 300 is used. As another example, when the light emitting device 100 has a parallel type, two wires 300 may be used. Moreover, when the light emitting device 100 has a flip chip type, no wire may be used.

The molding member 400 may surround the light emitting device 100 to protect it. Additionally, since the molding member 400 comprises a fluorescent substance, it may change the wavelength of light emitted from the light emitting device 100.

Figure 10:
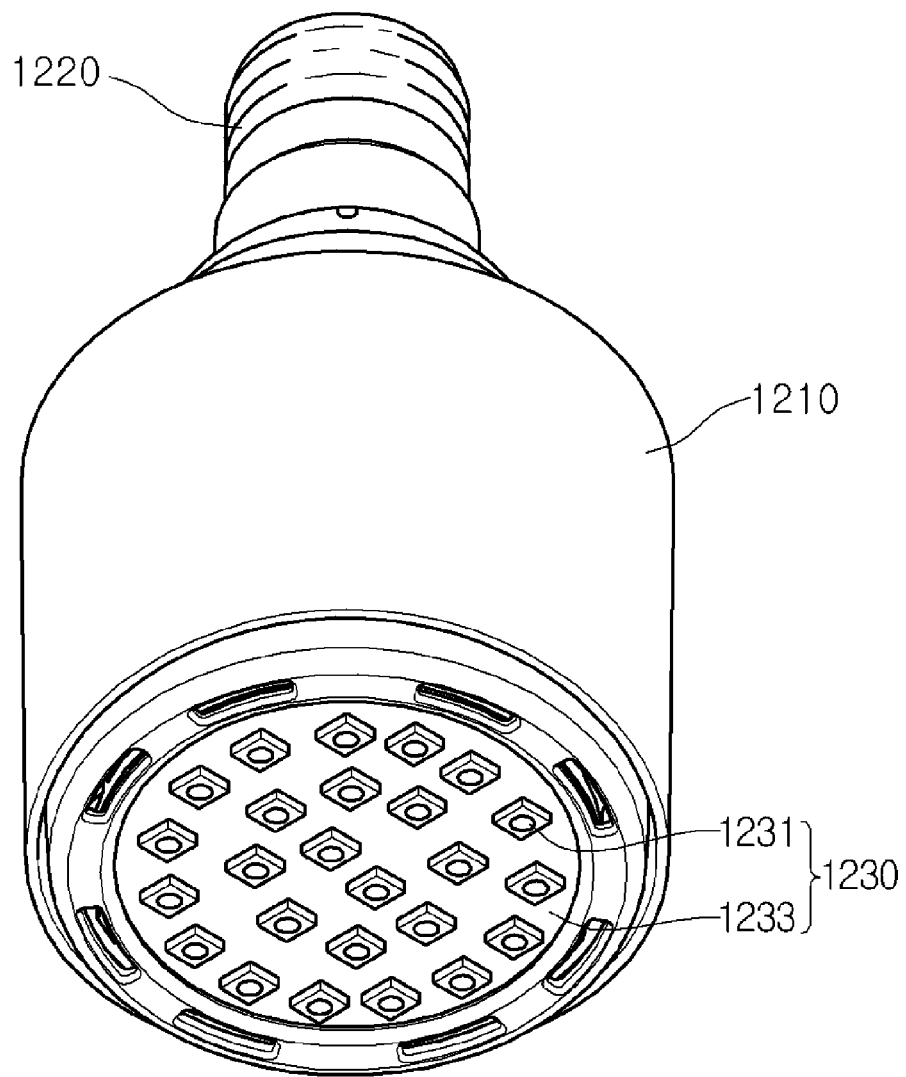
FIG. 10 is a view of a lighting apparatus having a light emitting device applied according to an embodiment.

FIG. 10 is a view of a lighting apparatus having a light emitting device applied according to an embodiment. However, the lighting apparatus 1200 of FIG. 10 is just one example of a lighting system, and the present invention is not limited thereto.

Referring to FIG. 10, the lighting apparatus 1200 may comprise a case main body 1210, a light emitting module 1230 at the case main body 1210, and a connection terminal 1220 at the case main body 1210 to receive power from an external power supply unit.

The case main body 1210 may be formed of a material having excellent heat dissipation characteristic, for example, metal material or resin material.

The light emitting module 1230 may comprise a substrate 1233 and a light emitting device 1231 mounted on the substrate according to at least one embodiment.

The substrate 1233 may be formed with a circuit pattern printed on an insulator, and may comprise a typical Printed Circuit Board (PCB), a metal core PCB, a flexible PCB, and a ceramic PCB.

Additionally, the substrate 1233 may be formed of a material that efficiently reflects light or may have the surface whose color efficiently reflects light such as white or silver.

The light emitting device 1231 according to at least one embodiment may be disposed on the substrate 1233. The light emitting device 1231 may comprise at least one Light Emitting Diode (LED). The light emitting diode may comprise a colored LED emitting each colored light of red, green, blue or white, and an UltraViolet (UV) LED emitting UV.

The light emitting module 1230 may be disposed to have various LED combinations to obtain color and brightness. For example, in order to obtain a high Color Rendering Index (CRI), a white LED, a red LED, and a green LED may be combined and disposed. Additionally, a fluorescent sheet may be further disposed on a propagation path of light emitted from the light emitting module 1230, and may change the wavelength of light emitted from the light emitting module 1230. For example, if the light emitted from the light emitting module 1230 has a blue wavelength range, the fluorescent sheet may comprise a yellow fluorescent substance. The light emitted from the light emitting module 1230 passes through the fluorescent sheet, and then, finally is displayed as white light.

The connection terminal 1220 is electrically connected to the light emitting module 1230 so that power may be supplied to the light emitting module 1230 through the connection terminal 1220. As shown in FIG. 10, the connection terminal 1220 is screwed into and coupled to an external power in a socket type, but is not limited thereto. For example, the connection terminal 1220 having a pin may be inserted into an external power or may be connected to an external power through wiring.

In relation to the above-mentioned lighting apparatus, at least one of a light guide member, a diffusion sheet, a light condensing sheet, and a brightness enhancing sheet, and a fluorescent sheet is disposed on a propagation path of light emitted from the light emitting module, so that desired optical effects may be obtained.

Moreover, the above light emitting device or light emitting device package may be applied to a display device such as a television and an electronic display board.

Figure 11:
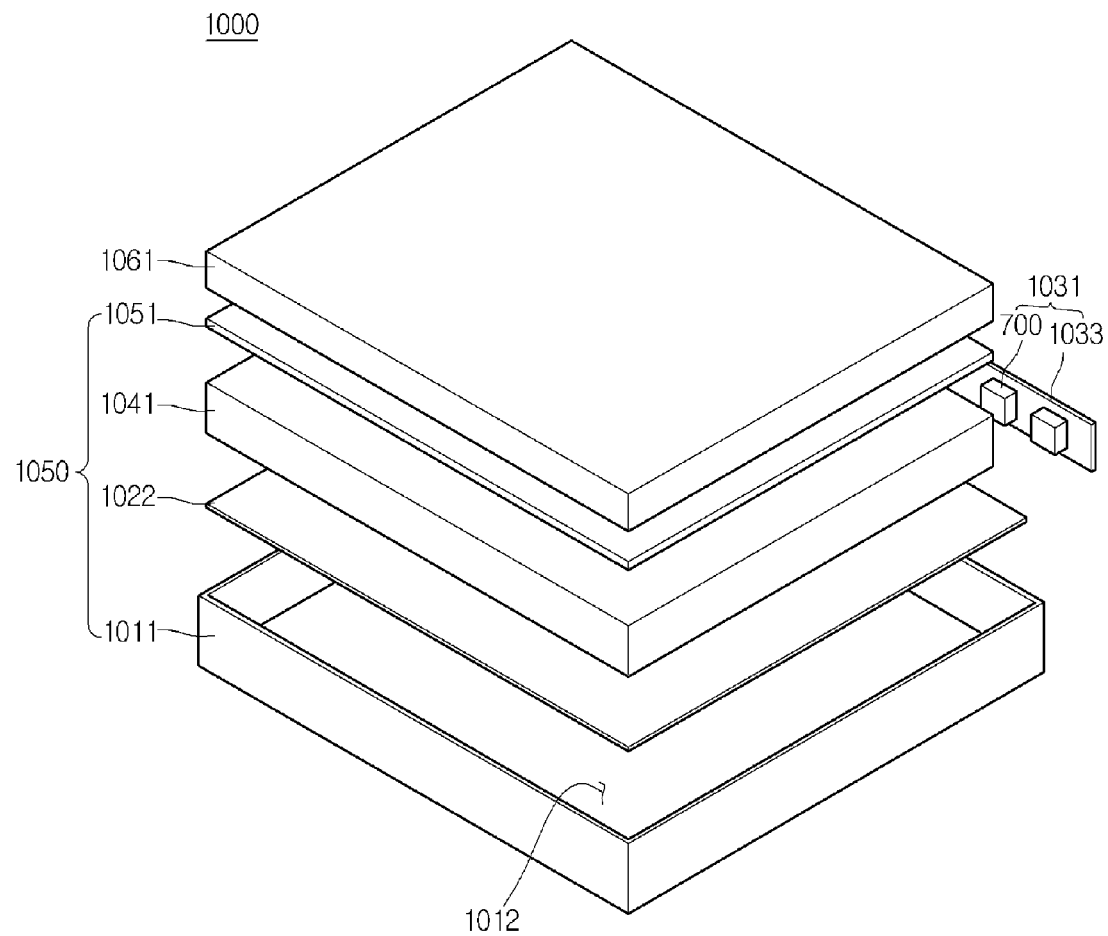
FIGS. 11 and 12 are views of a display device according having a light emitting device applied according to an embodiment.

Referring to FIG. 11, the display device 1000 may comprise a light guide plate 1041, a light emitting module 1031 providing light to the light guide plate 1041, a reflective member 1022 below the light guide plate 1041, an optical sheet 1051 on the light guide plate 1041, a display panel 1061 on the optical sheet 1051, and a bottom cover 1011 receiving the light guide plate 1041, the light emitting module 1031, and the reflective member 1022, but is not limited thereto.

The bottom cover 1011, the reflective sheet 1022, the light guide plate 1041, and the optical sheet 1051 may be defined as a light unit 1050.

The light guide plate 1041 may serve as a plane light source by diffusing light. The light guide plate 1041 may be formed of a transparent material, and may comprise one of an acrylic resin base such as polymethyl metaacrylate (PMMA), and polyethylene terephthlate (PET), poly carbonate (PC), cycloolefin copolymer (COC) and polyethylene naphthalate (PEN) resins.

The light emitting module 1031 provides light to at least one lateral side of the light guide plate 1041, and ultimately serves as a light source of a display device.

At least one light emitting module 1031 may be provided, and directly or indirectly may provide one lateral side of the light guide plate 1041. The light emitting module 1031 may comprise a substrate 1033 and the light emitting device or the light emitting device package 700 according to the above embodiment. The light emitting device package 700 may be arrayed on the substrate 1033 in a predetermined interval.

The substrate may be a PCB comprising a circuit pattern. However, the substrate 1033 may comprise a Metal Core PCB (MCPCB) and a Flexible PCB (FPCB) in addition to a typical PCB, but is not limited thereto. When the light emitting device package 700 is disposed on a lateral side of the bottom cover 1011 or a heat dissipation plate, the substrate 1033 may be removed. Here, a portion of the heat dissipation plate may contact on the top surface of the bottom cover 1011.

Moreover, in relation to the plurality of light emitting device packages 200, a light emitting surface that emits light may be mounted spaced a predetermined distance from the light guide plate 1041, but is not limited thereto. The light emitting device package 700 may directly or indirectly provide light to a light incident part, i.e., one lateral side of the light guide plate 1041, but is not limited thereto.

The reflective member 1022 may be disposed below the light guide plate 1041. The reflective member 1022 may improve the brightness of the light unit 1050 by reflecting light incident to the bottom side of the light guide plate 1041 toward the upper direction. The reflective member 1022 may be formed of PET, PC, and PVC resins but is not limited thereto. The reflective member 1022 may be the top surface of the bottom cover 1011 but is not limited thereto.

The bottom cover 1011 may receive the light guide plate 1041, the light emitting module 1031, and the reflective sheet 1022. For this, the bottom cover 1011 may comprise a receiving part 1012 having a box form whose top surface is opened, but is not limited thereto. The bottom cover 1011 may be coupled to a top cover, but is not limited thereto.

The bottom cover 1011 may be formed of a metal material or a resin material, and may be manufactured through a process such as press molding or extrusion molding. Additionally, the bottom cover 1011 may comprise a metallic or nonmetallic material having excellent thermal conductivity, but is not limited thereto.

The display panel 1061 may be a Liquid Crystal Display (LCD) panel, and may comprise transparent first and second substrates facing each other and a liquid crystal layer interposed between the first and second substrates. A polarizing plate may be attached to at least one side of the display panel 1061, but is not limited thereto. The display panel 1061 displays information through the light passing through the optical sheet 1051. The display device 1000 may be applied to the displays of various portable terminals and a notebook computer, and the monitor of a television.

The optical sheet 1051 is disposed between the display panel 1061 and the light guide plate 1041, and comprises at least one transparent sheet. The optical sheet 1051 may comprise at least one of a diffusion sheet, a parallel and/or vertical prism sheet, and a brightness enhancing sheet. The diffusion sheet diffuses incident light; the parallel and/or vertical prism sheet condenses incident light in a display area; and the brightness enhancing sheet reuses losing light to improve brightness. Additionally, a protective sheet may be disposed on the display panel 1061, but is not limited thereto.

Herein, the light guide plate 1041 and the optical sheet 1051 as an optical member may be disposed on a light propagation path of the light emitting module 1031, but are not limited thereto.

Figure 12:
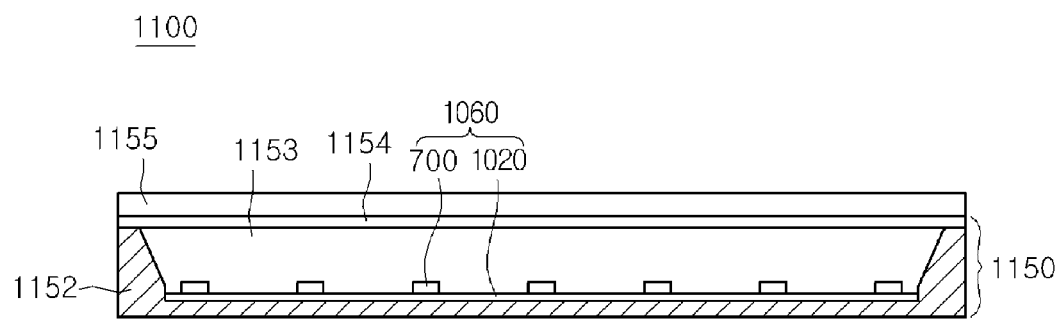

FIG. 12 is a view of a display device according to another embodiment.

Referring to FIG. 12, the display device 1100 comprises a bottom cover 1152, a substrate 1020 where the above light emitting device or light emitting device package 700 is arrayed, an optical member 1154, and a display panel 1155.

The substrate 1020 and the light emitting device package 700 may be defined as a light emitting module 1060. The bottom cover 1152, at least one light emitting module 1060, and the optical member 1154 may be defined as a light unit.

The bottom cover 1152 may comprise a receiving part 1153, but is not limited thereto.

Herein, the optical member 1154 may comprise at least one of a lens, a light guide plate, a diffusion sheet, a parallel and/or vertical prism sheet, and a brightness enhancing sheet. The light guide plate may be formed of a PC material or a PMMA material, and may be removed. The diffusion sheet diffuses incident light; the parallel and/or vertical prism sheet condenses incident light in a display area; and the brightness enhancing sheet reuses losing light to improve brightness.

The optical member 1154 is disposed on the light emitting module 1060, and thus may use the light emitted from the light emitting module 1060 as a plane light source, or diffuse or condense the light.

According to an embodiment, a light emitting device, a light emitting device package, and a lighting apparatus, which have a new structure, may be provided.

According to an embodiment, a light emitting device, a light emitting device package, and a lighting apparatus, which reduce crystal defects and improve brightness and driving characteristics, may be provided.

Additionally, the features, structures, and effects described in the above embodiments are included in at least one embodiment, but the present invention is not limited thereto. Furthermore, the features, structures, and effects in each embodiment may be combined or modified for other embodiments by those skilled in the art. Accordingly, contents regarding the combination and modification should be construed as being in the scope of the present invention.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
an n-type semiconductor layer including a first area and a second area in a plane;

an active layer disposed on the n-type semiconductor layer in the first area;
an electron barrier layer disposed on the active layer in the first area;
a substrate below the n-type semiconductor layer;
a crystal control layer on the substrate, the crystal control layer disposed between the substrate and the n-type semiconductor layer; and
a p-type semiconductor layer disposed on the electron barrier layer in the first area,
wherein the p-type semiconductor layer comprises:
a first semiconductor layer having a first dopant concentration:
a second semiconductor layer having a second dopant concentration on the first semiconductor layer;
a third semiconductor layer having a third dopant concentration on the second semiconductor layer, and
a fourth semiconductor layer having a fourth dopant concentration on the third semiconductor layer,
wherein the second dopant concentration has a smaller value than the first dopant concentration and the third dopant concentration,
wherein the fourth dopant concentration has a value of less than or equal to about $2 \times 10^{20}/cm^3$, which is greater than the third dopant concentration, and
wherein the fourth dopant concentration is equal to or greater than a maximum value of the third dopant concentration.

2. The light emitting device according to claim 1, further comprising a first electrode disposed in the second area of the n-type semiconductor layer.

3. The light emitting device according to claim 2, further comprising an n-type contact layer disposed between the n-type semiconductor layer and the first electrode.

4. The light emitting device according to claim 3, wherein the n-type contact layer is disposed on the n-type semiconductor layer, and has a first thickness in the first area and a second thickness in the second area.

5. The light emitting device according to claim 1, wherein each of the first and second dopant concentrations has a value of about $5 \times 10^{19}/cm^3$ to about $1 \times 10^{20}/cm^3$.

6. The light emitting device according to claim 1, wherein the second dopant concentration has a value of less than or equal to about $1 \times 10^{19}/cm^3$.

7. The light emitting device according to claim 1, wherein a dopant added to the p-type semiconductor layer comprises Mg.

8. The light emitting device according to claim 1, wherein the electron barrier layer comprises an AlGaN layer or an AlInN layer.

9. The light emitting device according to claim 1, further comprising a second electrode disposed on the p-type semiconductor layer in the first area.

10. The light emitting device according to claim 9, further comprising a transparent electrode between the p-type semiconductor layer and the second electrode.

11. The light emitting device according to claim 1, further comprising a buffer layer on the substrate.

12. The light emitting device according to claim 1, wherein the crystal control layer is formed of AlGaN/GaN.

13. A light emitting device comprising:
an n-type semiconductor layer;
an active layer disposed on the n-type semiconductor layer;
an electron barrier layer disposed on the active layer;
a substrate below the n-type semiconductor layer;
a crystal control layer on the substrate, the crystal control layer disposed between the substrate and the n-type semiconductor layer; and
a p-type semiconductor layer disposed on the electron barrier layer, the p-type semiconductor layer comprising:
a first semiconductor layer having a first dopant concentration;
a second semiconductor layer having a second dopant concentration;
a third semiconductor layer having a third dopant concentration; and
a fourth semiconductor layer having a fourth dopant concentration,
wherein the second dopant concentration has a smaller value than the first dopant concentration and the third dopant concentration,
wherein the fourth dopant concentration has a value of less than or equal to about $2 \times 10^{20}/cm^3$, which is greater than the third dopant concentration, and
wherein a maximum value of the second dopant concentration is less than a minimum value of the first dopant concentration.

14. The light emitting device according to claim 13, wherein each of the first and third dopant concentrations has a value of about $5 \times 10^{19}/cm^3$ to about $1 \times 10^{20}/cm^3$.

15. The light emitting device according to claim 13, wherein the second dopant concentration has a value of less than or equal to about $1 \times 10^{19}/cm^3$.

16. The light emitting device according to claim 13, wherein a dopant added to the p-type semiconductor layer comprises Mg.

17. The light emitting device according to claim 13, wherein the electron barrier layer comprises an AlGaN layer or an AlInN layer.

18. A light emitting device comprising:
an n-type semiconductor layer; and
an active layer disposed on the n-type semiconductor layer;
a substrate below the n-type semiconductor layer;
a crystal control layer on the substrate, the crystal control layer disposed between the substrate and the n-type semiconductor layer; and
a p-type semiconductor layer disposed on the active layer, the p-type semiconductor layer comprising:
a first semiconductor layer having a first dopant concentration;
a second semiconductor layer having a second dopant concentration;
a third semiconductor layer having a third dopant concentration; and
a fourth semiconductor layer having a fourth dopant concentration,
wherein the second dopant concentration has a smaller value than the first dopant concentration and the third dopant concentration,
wherein the fourth dopant concentration has a value of less than or equal to about $2 \times 10^{20}/cm^3$, which is greater than the third dopant concentration,
wherein a minimum value of the first dopant concentration is equal to a minimum value of the third dopant concentration, and
wherein a maximum value of the first dopant concentration is equal to a maximum value of the third dopant concentration.

* * * * *